(12) United States Patent
Min

(10) Patent No.: US 8,748,264 B2
(45) Date of Patent: Jun. 10, 2014

(54) SELF-ALIGNED CHARGE-TRAPPING LAYERS FOR NON-VOLATILE DATA STORAGE, PROCESSES OF FORMING SAME, AND DEVICES CONTAINING SAME

(75) Inventor: Kyu S. Min, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 145 days.

(21) Appl. No.: 11/693,925

(22) Filed: Mar. 30, 2007

(65) Prior Publication Data

US 2008/0237691 A1 Oct. 2, 2008

(51) Int. Cl.
*H01L 21/336* (2006.01)
(52) U.S. Cl.
USPC .............. 438/264; 438/257; 257/E21.666
(58) Field of Classification Search
USPC .............. 438/257, 263, 264; 257/E21.422, 257/E21.666, E21.68–E21.688, 321
See application file for complete search history.

(56) References Cited

U.S. PATENT DOCUMENTS

| 6,649,472 B1* | 11/2003 | Hsieh | 438/257 |
|---|---|---|---|
| 2006/0208302 A1* | 9/2006 | Shin et al. | 257/314 |
| 2006/0237775 A1* | 10/2006 | Forbes | 257/315 |
| 2007/0057292 A1* | 3/2007 | Park et al. | 257/213 |
| 2008/0237680 A1* | 10/2008 | Pangal et al. | 257/315 |

OTHER PUBLICATIONS

Lim, Seung-Hyun, et al., "Nonvolatile MOSFET memory based on high density WN nanocrystal layer fabricated by novel PNL (pulsed nucleation layer) method", *2005 Symposium on VLSI Technology, 2005. Digest of Technical Papers.*, (2005),190-191.

* cited by examiner

*Primary Examiner* — Daniel Whalen
(74) *Attorney, Agent, or Firm* — Blakely, Sokoloff, Taylor & Zafman LLP

(57) ABSTRACT

A discrete storage element film is disposed above a tunneling dielectric film against a shallow trench isolation structure and under conditions to resist formation of the discrete storage element film upon vertical exposures of the shallow trench isolation structure. A discrete storage element film is also disposed above a tunneling dielectric film against a recessed isolation structure. A microelectronic device incorporates the discrete storage element film. A computing system incorporates the microelectronic device.

5 Claims, 9 Drawing Sheets

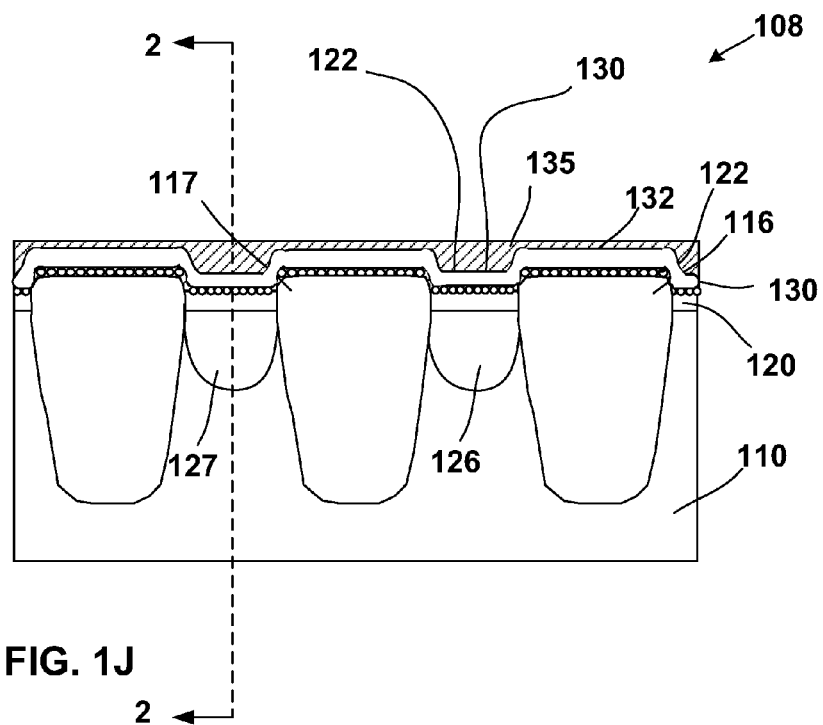
FIG. 1J
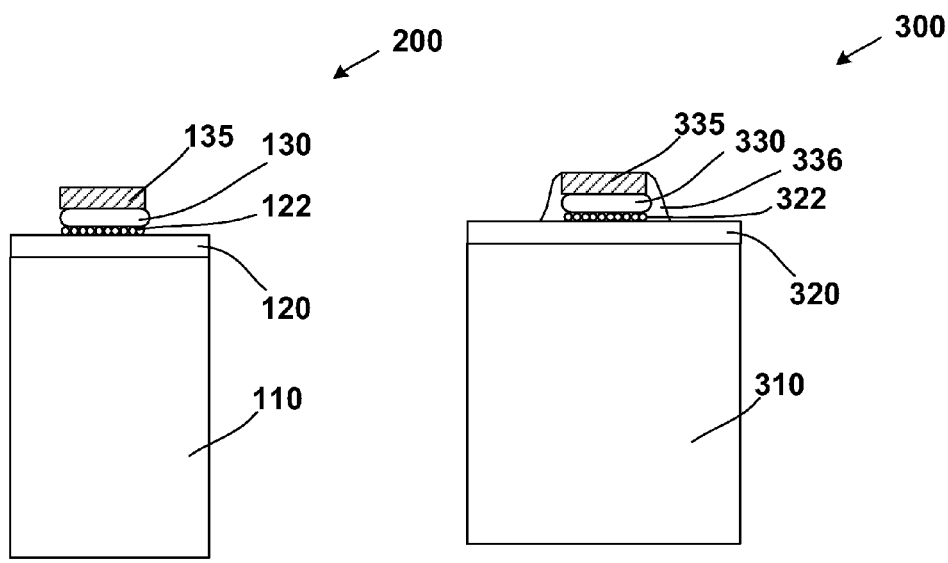
FIG. 2  FIG. 3

SELF-ALIGNED CHARGE-TRAPPING LAYERS FOR NON-VOLATILE DATA STORAGE, PROCESSES OF FORMING SAME, AND DEVICES CONTAINING SAME

TECHNICAL FIELD

Embodiments of the present invention relate generally to semiconductor devices and more particularly to processes for forming non-volatile semiconductor memory devices.

TECHNICAL BACKGROUND

Semiconductor miniaturization creates challenges that can affect semiconductor device performance and reliability. For non-volatile memory (NVM) devices, such as electrically erasable programmable read-only memory (EEPROM) devices, the leakage of charge stored in a memory cell's floating gate can be a challenge.

BRIEF DESCRIPTION OF THE DRAWINGS

In order to depict the manner in which the embodiments are obtained, a more particular description of embodiments briefly described above will be rendered by reference to exemplary embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which:

FIG. 1J is a cross-section elevation of the microelectronic device depicted in FIG. 1H after further processing according to an embodiment;

FIG. 2 is a cross-section elevation of the microelectronic device depicted in FIG. 1J according to an embodiment, taken from a different view;

FIG. 3 is a cross-section elevation of the microelectronic device according to an embodiment;

DETAILED DESCRIPTION

The present disclosure relates to discrete storage element formation for non-volatile memory semiconductor fabrication.

The following description includes terms, such as upper, lower, first, second, etc. that are used for descriptive purposes only and are not to be construed as limiting. The embodiments of an apparatus or article described herein can be manufactured, used, or shipped in a number of positions and orientations. The terms "die" and "chip" generally refer to the physical object that is the basic workpiece transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

The term "discrete storage element" can mean a nano-sized crystalline material that has been located upon a tunneling dielectric film. The term "nanocrystal memory" can mean the nano-sized crystalline material that has been located upon a tunneling dielectric film and that has been incorporated into a memory device such as a nonvolatile memory structure.

Discrete storage element (nanocrystal) memory gates use isolated semiconductive or conductive nanocrystals as discrete storage elements to store the charge in the floating gate. The isolated nature of the nanocrystals reduces the vulnerability of the floating gate to charge leakage that can result from defects in the tunnel dielectric layer. Instead of providing a leakage path for the entire floating gate, the defect(s) provide a leakage path only for individually charged nanocrystals.

Important considerations with respect to nanocrystal fabrication include the density of nanocrystals and the uniformity of the nanocrystal electronic tunneling distance. Higher nanocrystal densities lead to an increased change in the threshold voltage and less overall variability in the distribution of threshold voltages across the memory array. Uniform tunneling distances facilitate reproducible charging and discharging of the floating gate.

Reference will now be made to the drawings wherein like structures will be provided with like reference designations. In order to show the structures of embodiments most clearly, the drawings included herein are diagrammatic representations of various embodiments. Thus, the actual appearance of the fabricated structures, for example in a photomicrograph, may appear different while still incorporating the structures of embodiments. Moreover, the drawings show only the structures useful to understand the embodiments. Additional structures known in the art have not been included to maintain the clarity of the drawings.

Figure 1A:
FIG. 1A is a cross-section elevation of a microelectronic device during processing according to an embodiment.

FIG. 1A is a cross-section elevation of a microelectronic device 100 during processing according to an embodiment. A substrate 110 is depicted with a gate oxide layer 112 disposed on one surface. In an embodiment, the substrate 110 is a semiconductive material and the gate oxide layer 112 is a thermally grown oxide film that can be prepared by a wafer supplier. The gate oxide layer 112 can also be referred to as a tunneling oxide or a tunneling dielectric layer.

Figure 1B:
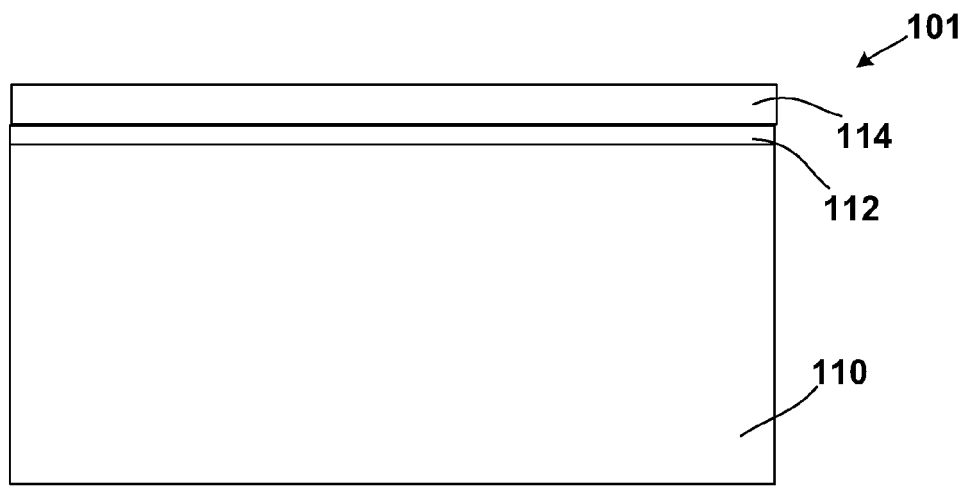
FIG. 1B is a cross-section elevation of the microelectronic device depicted in FIG. 1A after further processing according to an embodiment.

FIG. 1B is a cross-section elevation of the microelectronic device depicted in FIG. 1A after further processing according to an embodiment. The microelectronic device 101 has been processed with a bulk dielectric film 114 such as a nitride layer including for example, $Si_3N_4$ and more generically SixNy. The microelectronic device 101 can also be processed with a bulk dielectric film 114 such as polysilicon. The microelectronic device 101 can also be processed with a bulk dielectric film 114 such as an oxide layer that has a different etch response from other oxide structures it may be near. The bulk dielectric film 114 can be a non-oxide dielectric in an embodiment.

Figure 1C:
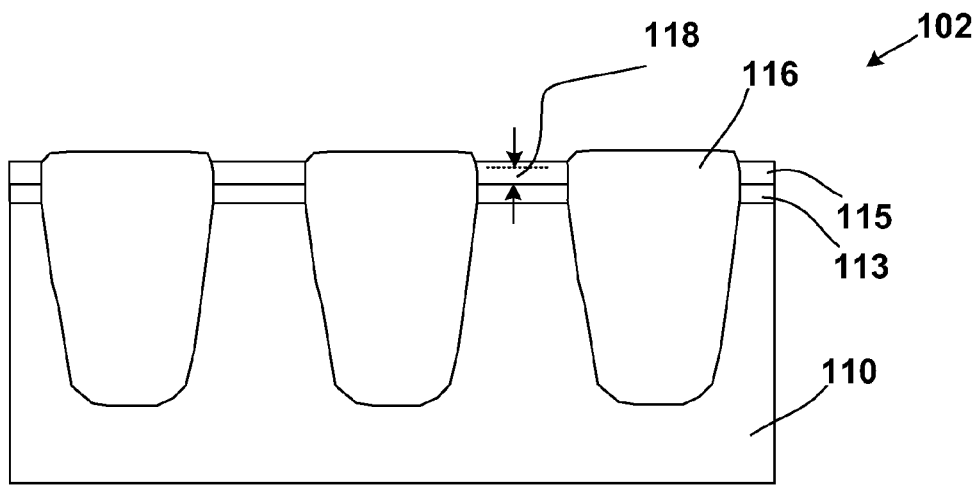
FIG. 1C is a cross-section elevation of the microelectronic device depicted in FIG. 1B after further processing according to an embodiment.

FIG. 1C is a cross-section elevation of the microelectronic device depicted in FIG. 1B after further processing according to an embodiment. The microelectronic device 102 has been processed by patterning the bulk dielectric film 114 (FIG. 1B) to a shallow-trench isolation pattern (STI) film 115, and an STI structure 116 has been filled into the STI pattern film 115, and into the substrate 110. Further processing is also depicted in FIG. 1C, such that etchback processing has given the STI structure 116 a height 118 above a repaired gate oxide layer 113 for a given application.

Figure 1D:
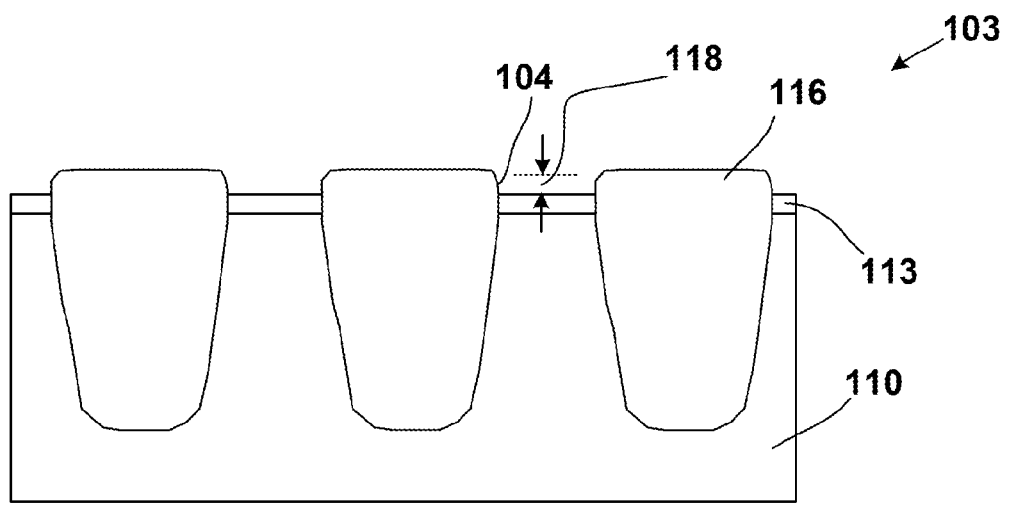
FIG. 1D is a cross-section elevation of the microelectronic device depicted in FIG. 1C after further processing according to an embodiment.

FIG. 1D is a cross-section elevation of the microelectronic device depicted in FIG. 1C after further processing according to an embodiment. The microelectronic device 103 has been processed to remove the STI pattern film 115 (FIG. 1C, which was a sacrificial film 115). During processing, a wet etch has been done, according to an embodiment, and the gate oxide layer 112 (FIG. 1C) has acted as an etch stop. The gate oxide layer 113, however, has been slightly altered and is referred to herein as an etch stop layer 113. The STI structure 116 exhibits a prominence above the etch stop layer 113. Further, the STI structure 116 exhibits a sidewall 104.

Figure 1E:
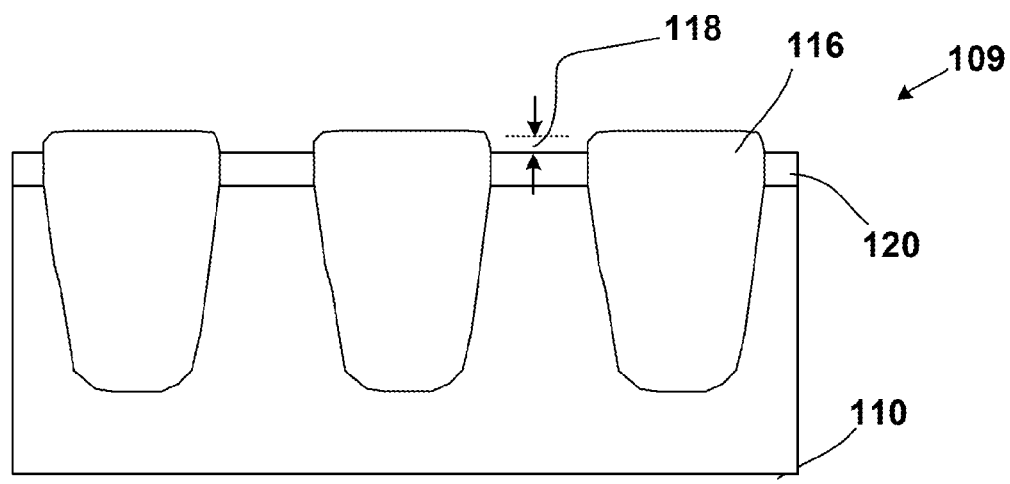
FIG. 1E is a cross-section elevation of the microelectronic device depicted in FIG. 1D after further processing according to an embodiment.

FIG. 1E is a cross-section elevation of the microelectronic device depicted in FIG. 1D after further processing according to an embodiment. The microelectronic device 109 exhibits a repaired etch stop layer 113 (FIG. 1D). In an embodiment, the repaired etch stop layer 113 has been thermally regrown to form a tunneling dielectric layer 120.

Figure 1F:
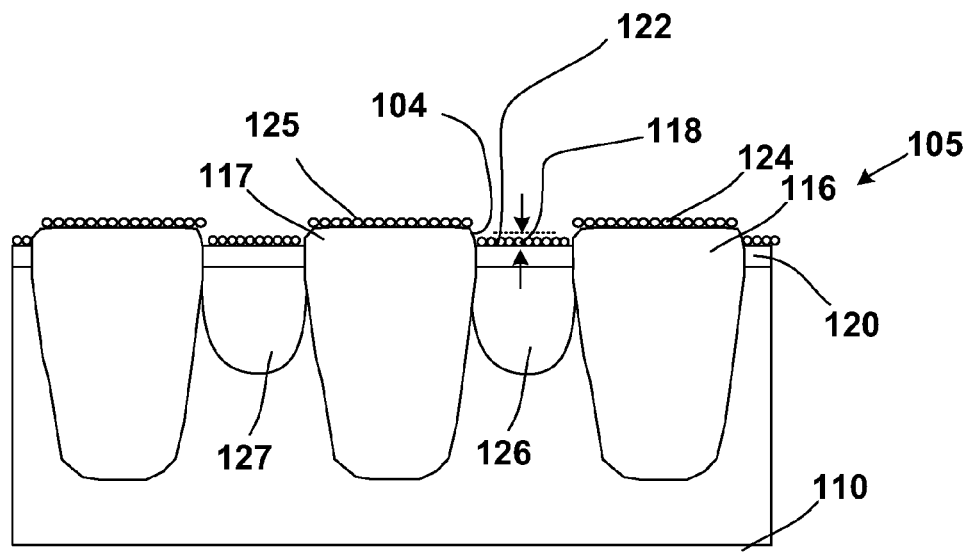
FIG. 1F is a cross-section elevation of the microelectronic device depicted in FIG. 1E after further processing according to an embodiment.

FIG. 1F is a cross-section elevation of the microelectronic device depicted in FIG. 1E after further processing according to an embodiment. The microelectronic device 105 has been sputter treated to form a discontinuous film of discrete nanocrystals 122. The nanocrystals 122 are also referred to as a charge-trapping layer 122. In an embodiment, the nanocrystals 122 are formed from a sputtered metallic target such as a silver target. In an embodiment, the nanocrystals 122 are sputtered from nickel. In an embodiment, the nanocrystals 122 are sputtered from copper. In an embodiment, the nanocrystals 122 are sputtered from platinum or a platinum-group metal. In an embodiment, a non-metallic material is used as the charge-trapping layer 122. In an embodiment, the nanocrystals 122 are sputtered from a silicon nitride target. The silicon nitride can be $Si_3N_4$ or another silicon nitride such as SiN. In an embodiment, the silicon nitride is a non-stoichiometric blend of silicon and nitrogen.

In an embodiment, formation of the charge-trapping layer 122 is done by collimated sputtering. In an embodiment, formation of the charge-trapping layer 122 is done by a directional plasma deposition.

In any of the disclosed embodiments of forming the charge-trapping layer 122, the sidewall 104 acts as another separator between charge-trapping layers.

FIG. 1F also depicts incidental nanocrystals 124 that are located upon the STI structure 116. As depicted in FIG. 1F however, the height 118 of the STI structure 116 along with the directional deposition of the charge-trapping layer 122, has created a self-aligned breach between the charge-trapping layer 122 as deposited above the tunneling dielectric layer 120 where it is required, and the incidental nanocrystals 124. Consequently, the proclivity for charge leaking through a given layer of incidental nanocrystals 125 is significantly reduced across a given STI structure 117, between a first active area 126 and a second active area 127. Because of the topology of the STI structure 117 and because no extra processing is needed to create the isolation of the charge-trapping layer 122 between the STI structures 116 and 117, a significant reduction in charge leaking is achieved. Similarly, because of the directional formation of the charge-trapping layer 122, the likelihood of the nanocrystals to be found upon the vertical sidewall 104 is also significantly reduced. This topology is sometimes referred to as "reentrant", meaning that it is difficult to form deposits upon the substantially vertical structures with respect to a directional deposition. This topology is also referred to as a "reentrant undercut" form factor.

Further, as the charge-trapping layer 122 is formed as discrete sections, the granular quality of the charge-trapping layer 122 also contributes to reduced charge leaking at a boundary. In an embodiment, the height 118 is about 7 nm and the width of a given active area 126 is about 35 nm.

Figure 1G:
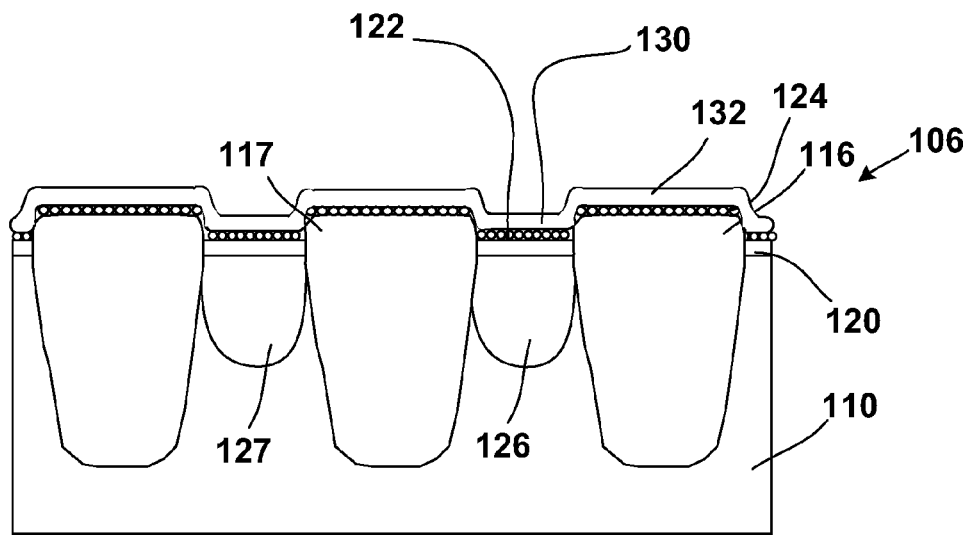
FIG. 1G is a cross-section elevation of the microelectronic device depicted in FIG. 1F after further processing according to an embodiment.

FIG. 1G is a cross-section elevation of the microelectronic device depicted in FIG. 1F after further processing according to an embodiment. The microelectronic device 106 has been processed with a control gate dielectric 130 deposition to seal up the charge-trapping layer 122. The control gate dielectric 130 is a high-k dielectric material according to an embodiment. In an embodiment, the control gate dielectric 130 is an undoped chemical vapor deposition (CVD) oxide layer. Incidental formation of the dielectric is located on the STI structure 116 at item 132. In an embodiment, the control gate dielectric 130 is formed using other deposition processes and includes other dielectric materials or combinations of dielectric materials, such as an oxide-nitride-oxide (ONO) film stack, or the like.

Figure 1H:
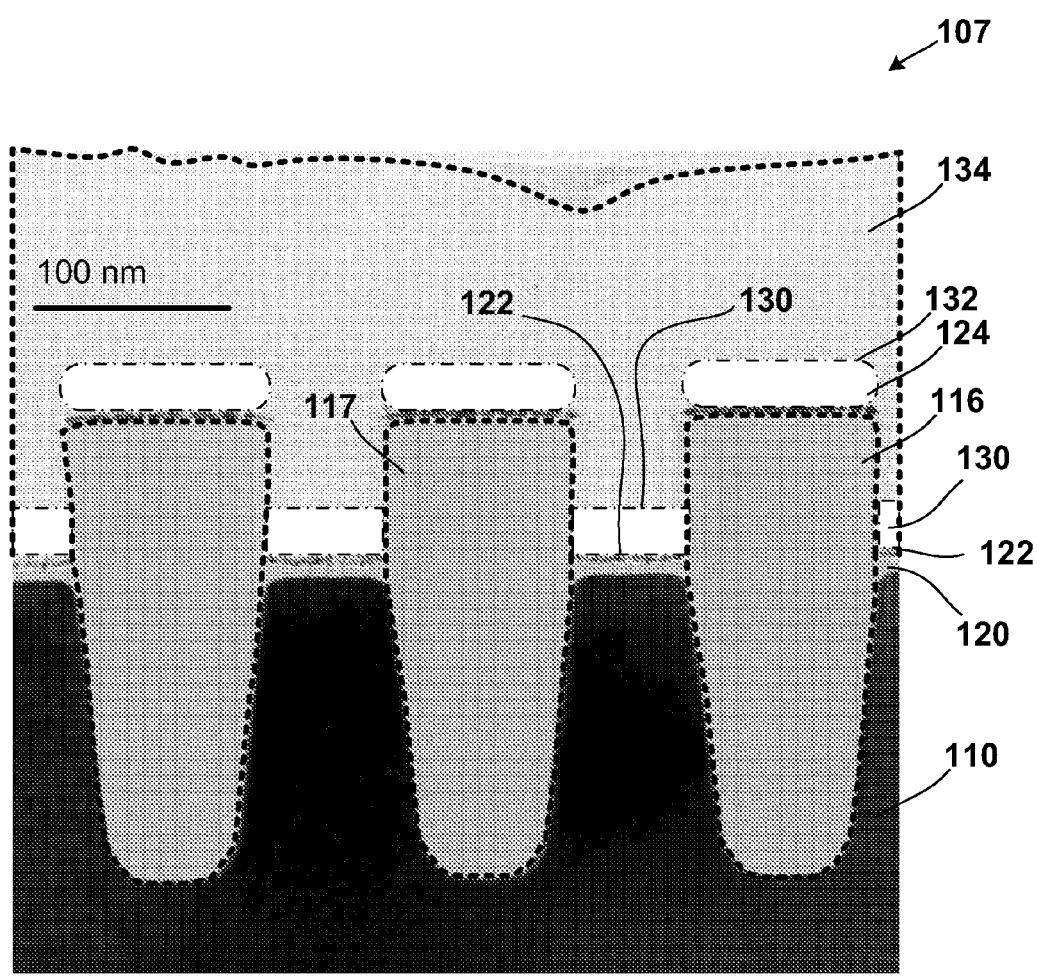
FIG. 1H is a cross-section elevation of the microelectronic device depicted in FIG. 1G after further processing according to an embodiment.

FIG. 1H is a cross-section elevation computer-enhanced photomicrograph of a microelectronic device during processing according to an embodiment. The photomicrograph 107 depicts a scale of 100 nanometers (nm). The photomicrograph 107 was taken from a structure such as the microelectronic device 106 depicted in FIG. 1G. The control gate dielectric 130 has been computer enhanced for clarity. The charge-trapping layer 122 and the STI structures 116 and 117 have also been computer enhanced. A control gate film 134 is depicted as having been deposited over the substrate 110 and the topology built upon the substrate 110. The control gate film 134 has also been computer enhanced. In an embodiment, the control gate film 134 is a doped polycrystalline silicon material. In an embodiment, the control gate film 134 is a metallic material.

FIG. 1H also illustrates a distinct breach between the charge-trapping layer 122 and the incidental nanocrystals 124, due to the pillar form-factor of the STI structures 116 and 117, and the directional deposition of the charge-trapping layer 122 that has formed a reentrant quality upon the tunneling dielectric layer 120.

FIG. 1J is a cross-section elevation of the microelectronic device depicted in FIG. 1H after further processing according to an embodiment. The microelectronic device 108 has been processed such that the control gate film 134 (FIG. 1H) has been planarized. In an embodiment, the control gate film 135 is planarized by chemical-mechanical planarization (CMP) until a selected depth is achieved.

FIG. 2 is a cross-section elevation of the microelectronic device depicted in FIG. 1J, taken from a different view according to an embodiment. The section line 2-2 in FIG. 1J reveals the view depicted in FIG. 2. The substrate 110 and the tunneling dielectric layer 120 support the charge-trapping layer 122. The control gate dielectric 130 insulates the charge-trapping layer 122 from the control gate film 135. As depicted a floating gate stack 200 is illustrated.

FIG. 3 is a cross-section elevation of the microelectronic device 300 according to an embodiment. The elevation in FIG. 3 is similar in cross-section as the elevation depicted in FIG. 2. A substrate 310 and a tunneling dielectric layer 320 support a charge-trapping layer 322 that has been directionally and self-aligning deposited as described herein. A control gate dielectric 330 insulates the charge-trapping layer 322 from a control gate film 335 A dielectric spacer 336 has been formed as part of the floating gate stack.

Figure 4:
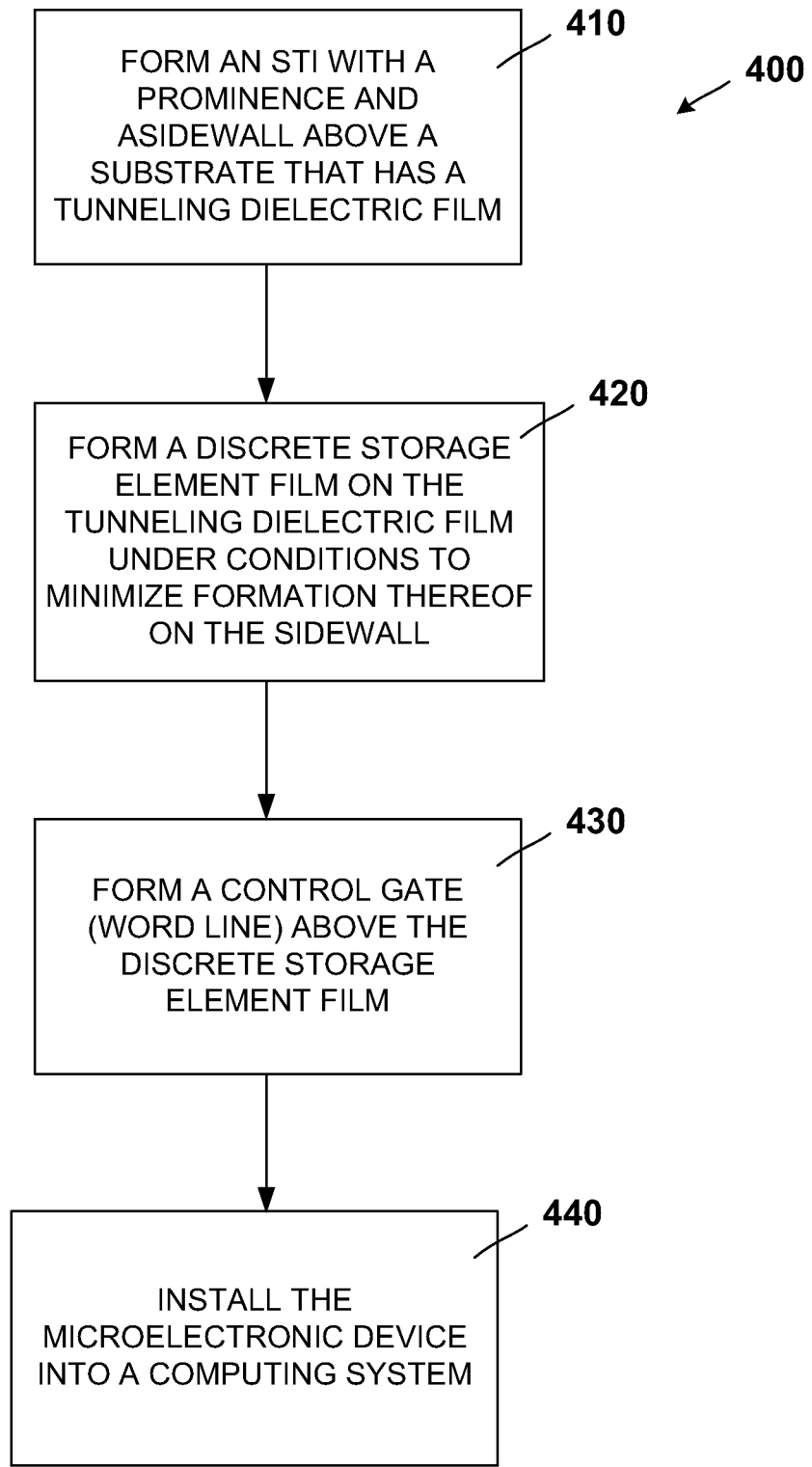
FIG. 4 is a flow chart that describes process flow embodiments.

FIG. 4 is a flow chart 400 that describes process flow embodiments.

At 410, the process includes forming an STI structure with a prominence and a sidewall, above a substrate that includes a tunneling dielectric layer.

At 420, the process includes forming a discrete storage element film on the tunneling dielectric film that is adjacent and contiguous to the STI structure. The process is carried out to minimize formation of the discrete storage element film upon the sidewall.

At 430, a control gate (word line) is formed above the discrete storage element film to form a microelectronic device.

At 440 the microelectronic device is installed into a computing system.

Figure 5:
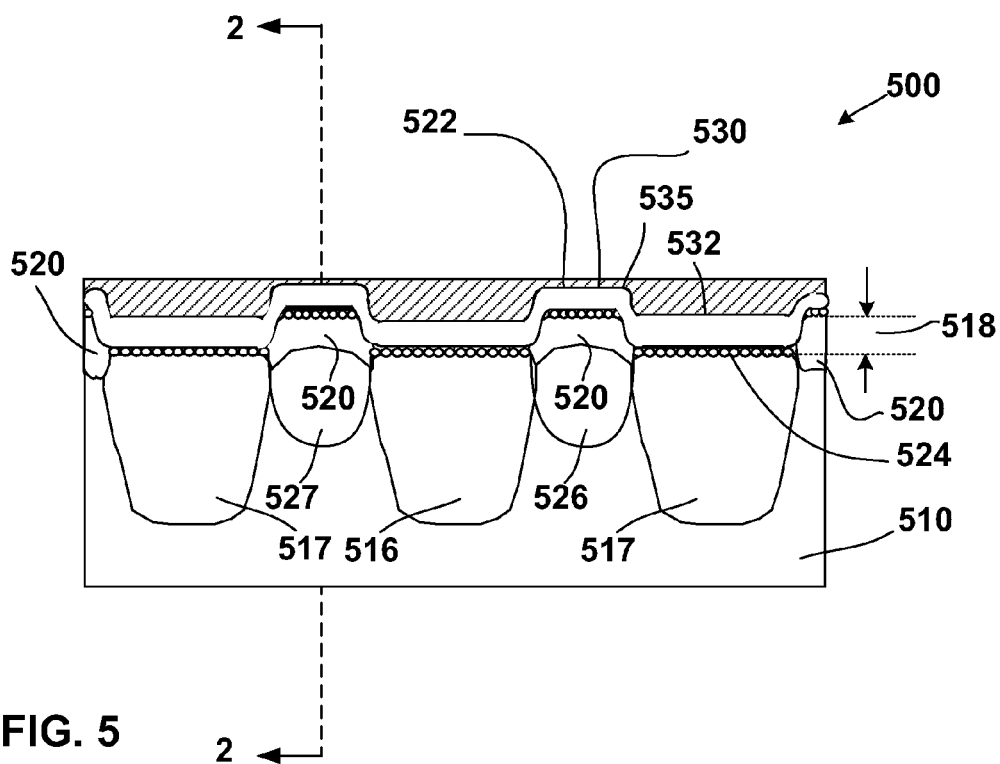
FIG. 5 is a cross-section elevation of a microelectronic device during processing according to an embodiment.

FIG. 5 is a cross-section elevation of a microelectronic device 500 during processing according to an embodiment. A substrate 510 is depicted with a thermally regrown tunneling dielectric layer 520 disposed on one surface. The structure depicted in FIG. 5 essentially an inverted topology compared to the structure depicted in FIG. 1J. In other words, an isolation structure 517 exhibits depressed topology compared to a prominence of the substrate 510 between two occurrences of the isolation structure 517. Further processing has been carried out to achieve a charge-trapping layer according to an embodiment, such that the microelectronic device 500 has been sputter treated to form a discontinuous film of discrete nanocrystals 522. The nanocrystals 522 are also referred to as a charge-trapping layer 522. In an embodiment, the nanocrystals 522 are formed from a sputtered metallic target such as a silver target. In an embodiment, the nanocrystals 522 are sputtered from nickel. In an embodiment, the nanocrystals 522 are sputtered from copper. In an embodiment, the nanocrystals 522 are sputtered from platinum or a platinum-group metal. In an embodiment, a non-metallic material is used as the charge-trapping layer 522. In an embodiment, the nanocrystals 522 are sputtered from a silicon nitride target. The silicon nitride can be $Si_3N_4$ or another silicon nitride such as SiN. In an embodiment, the silicon nitride is a non-stoichiometric blend of silicon and nitrogen.

In any of the disclosed embodiments of forming the charge-trapping layer 522, the tunneling dielectric 520 acts as another separator between charge-trapping layers. FIG. 5 also depicts incidental nanocrystals 524 that are located upon the isolation structure 517. As depicted in FIG. 5, however, the depth 518 of the isolation structure 517, along with the directional deposition of the charge-trapping layer 522, has created a self-aligned breach between the charge-trapping layer 522 as deposited above the tunneling dielectric layer 520 where it is required, and the incidental nanocrystals 524. Consequently, the proclivity for charge leaking through a given layer of incidental nanocrystals 524 is significantly reduced across a given isolation structure 517, between a first active area 526 and a second active area 527. Because of the topology of the isolation structure 517 and because no extra processing is needed to create the isolation of the charge-trapping layer 522 between the isolation structures 516 and 517, a significant reduction in charge leaking is achieved.

Further, as the charge-trapping layer 522 is formed as discrete sections, the granular quality of the charge-trapping layer 522 also contributes to reduced charge leaking at a boundary. In an embodiment, the depth 518 is about 7 nm and the width of a given active area 526 is about 35 nm.

FIG. 5 illustrates further processing with a control gate dielectric 530 deposition to seal up the charge-trapping layer 522. The control gate dielectric 530 is a high-k dielectric material according to an embodiment. In an embodiment, the control gate dielectric 530 is an undoped CVD oxide layer. Incidental formation of the dielectric is located on the isolation structure 517 at item 532.

The microelectronic device 500 has also been processed such that a control gate film 535 has been deposited and planarized. The view taken along the line 2-2 is also useful in FIG. 5, when viewed in side-section at FIG. 2.

Figure 6:
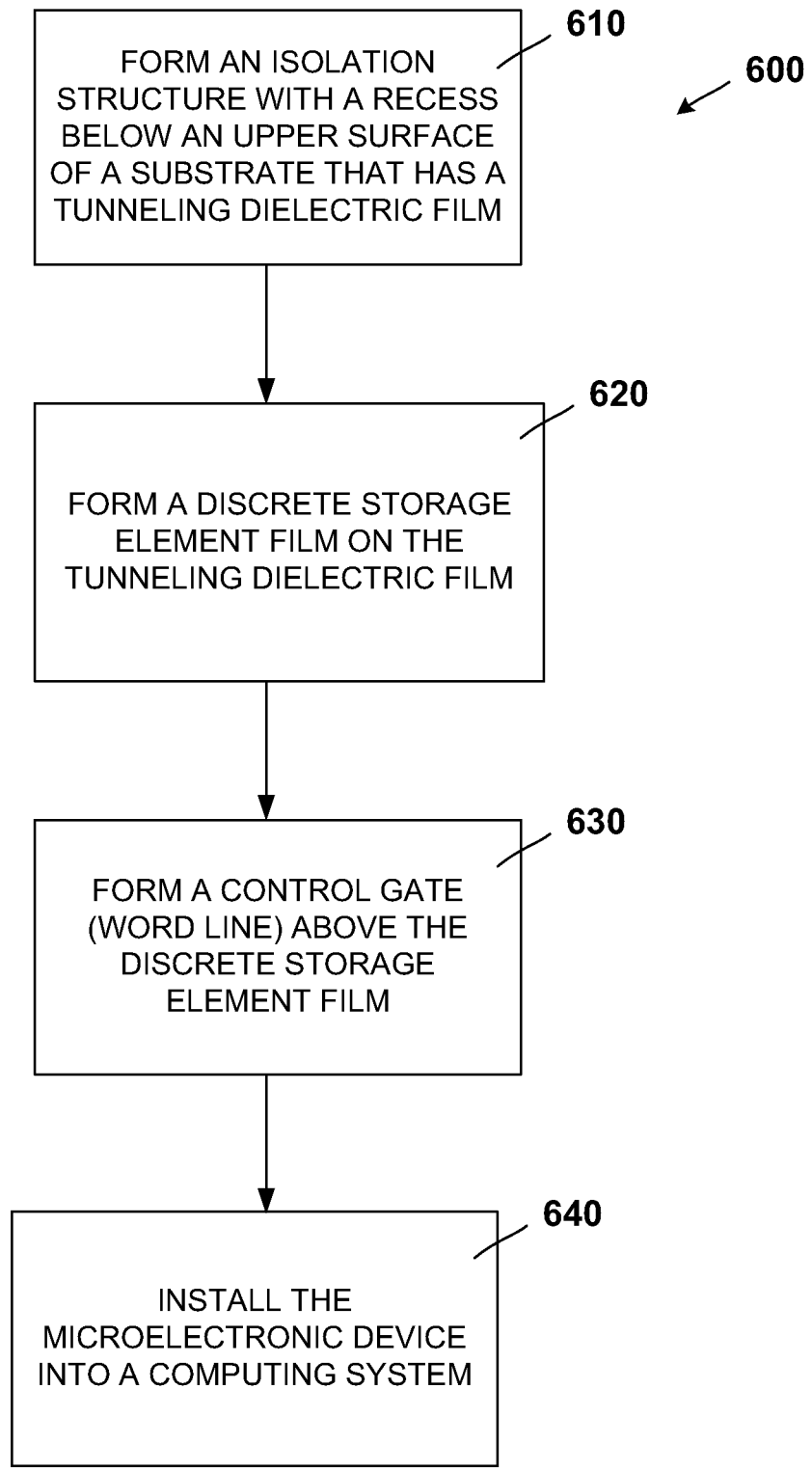
FIG. 6 is a flow chart that describes process flow embodiments.

FIG. 6 is a flow chart 600 that describes process flow embodiments that relate to the structure depicted in FIG. 5.

At 610, the process includes forming an isolation structure below an upper surface of a substrate that includes a tunneling dielectric layer.

At 620, the process includes forming a discrete storage element film on the tunneling dielectric film that is adjacent and contiguous to the isolation structure.

At 630, a control gate (word line) is formed above the discrete storage element film to form a microelectronic device.

At 640, the microelectronic device is installed into a computing system.

Figure 7:
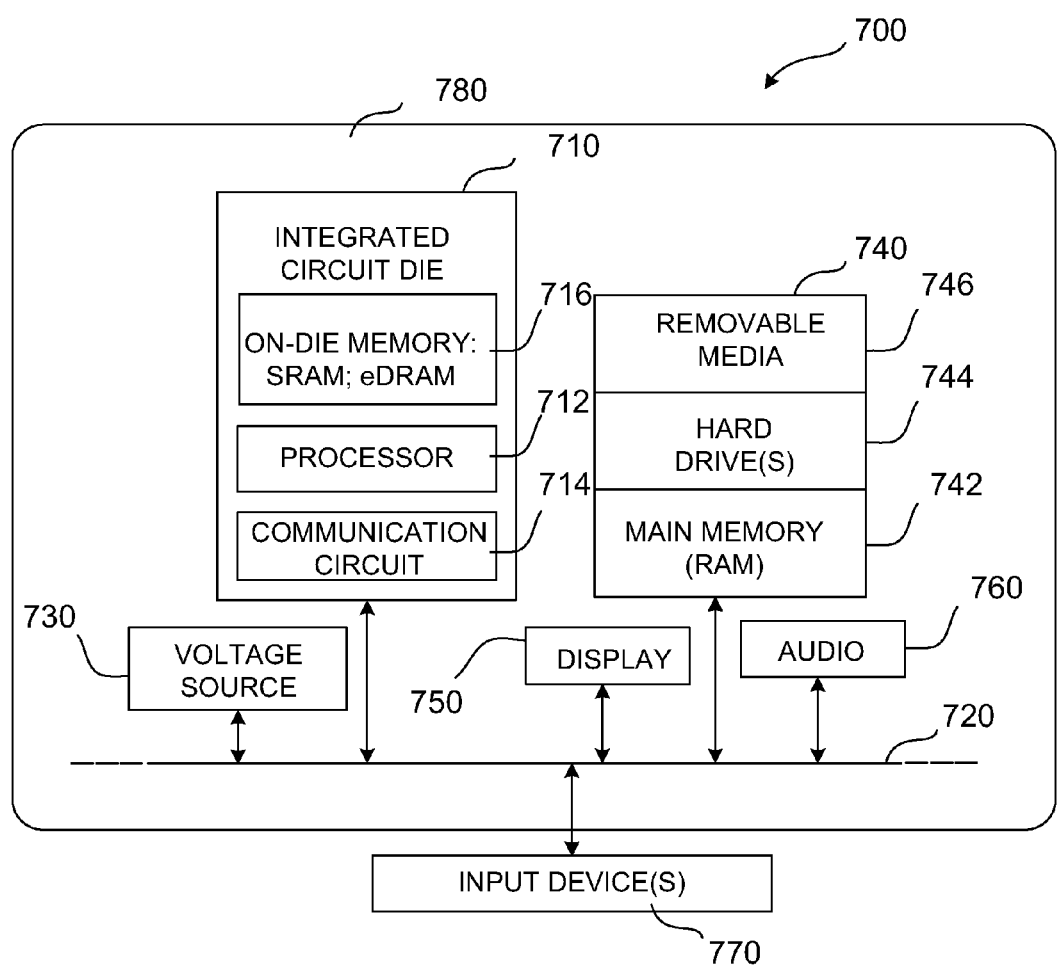
FIG. 7 is a schematic of a computing system according to an embodiment.

FIG. 7 is a schematic of an electronic system 700 according to an embodiment. The electronic system 700, also referred to as a computing system 700, incorporates at least one microelectronic device, such as an IC die with a floating gate with a discrete storage element film as illustrated in FIGS. 1J, 2, and 3. In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit or combination of circuits according to an embodiment. In an embodiment, the integrated circuit 710 includes a processor 712 that can be of any type. As used herein, the processor 712 can be referred to as a "first die." The processor means any type of circuit such as, but not limited to, a microprocessor, a microcontroller, a graphics processor, a digital signal processor, or another processor. Accordingly, a floating gate with a discrete storage element film can be part of the electronic system that seats at least one die such as a processor or a die selected from a processor or another die that is part of a chipset. Other types of circuits that can be included in the integrated circuit 710 are a custom circuit or an application-specific integrated circuit (ASIC), such as a communications circuit 714 for use in wireless devices such as cellular telephones, pagers, portable computers, two-way radios, and similar electronic systems. In an embodiment, the integrated circuit 710 includes on-die memory 716 such as static random-access memory (SRAM).

In an embodiment, the integrated circuit 710 includes on-die memory 716 such as embedded dynamic random-access memory (eDRAM).

In an embodiment, the electronic system 700 also includes an external memory 740 that in turn may include one or more memory elements suitable to the particular application, such as a main memory 742 in the form of random-access memory (RAM), one or more hard drives 744, and/or one or more drives that handle removable media 746, such as diskettes, compact disks (CDs), digital video disks (DVDs), flash memory keys with a floating gate with a discrete storage element film, and other removable media known in the art. In an embodiment, any portion or all of the external memory 740 can be referred to as a "second die."

In an embodiment, the electronic system 700 also includes a display device 750 and an audio output 760. In an embodiment, the electronic system 700 includes an input 770, such as a keyboard, mouse, trackball, game controller, microphone, voice-recognition device, or any other device that inputs information into the electronic system 700.

As shown herein, the integrated circuit 710 can be implemented in a number of different embodiments, including an electronic package, an electronic system, a computer system, one or more methods of fabricating an integrated circuit, and one or more methods of fabricating an electronic assembly that includes the floating gate with a discrete storage element film as set forth herein in the various embodiments and their art-recognized equivalents. The electronic system can be contained within a housing 780, such as the skin of a hand-held device, for example, a cell phone or a personal digital assistant (PDA). The elements, materials, geometries, dimensions, and sequence of operations can all be varied to suit particular packaging requirements.

This Detailed Description refers to the accompanying drawings that show, by way of illustration, specific aspects and embodiments in which the present disclosure may be practiced. These embodiments are described in sufficient detail to enable those skilled in the art to practice the disclosed embodiments. Other embodiments may be utilized and structural, logical, and electrical changes may be made without departing from the scope of the present disclosure. The various embodiments are not necessarily mutually exclusive, as some embodiments can be combined with one or more other embodiments to form new embodiments.

The term "horizontal" as used in this document is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The Detailed Description is, therefore, not to be taken in a limiting sense, and the scope of this disclosure is defined only by the appended claims, along with the full scope of equivalents to which such claims are entitled.

The Abstract is provided to comply with 37 C.F.R. § 1.72 (b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages that have been described and illustrated in order to explain the nature of these embodiments may be made without departing from the principles and scope of the inventions as expressed in the subjoined claims.

What is claimed is:

1. A process comprising:
   forming a shallow trench isolation (STI) in a semiconductive substrate, wherein the STI includes a prominence with a sidewall, the prominence having a top width wider than a bottom width of the prominence, and wherein forming the STI includes forming the STI through a sacrificial film and a repaired gate oxide layer;
   depositing a discrete storage element film upon a tunnel dielectric film, wherein depositing the discrete storage element film is carried out with exposure to, and laterally adjacent to, a reentrant undercut form factor of the sidewall of the STI, and wherein depositing the discrete storage element film is carried out without completely covering the reentrant undercut form factor of the sidewall of the STI;
   forming a gate dielectric above the discrete storage element film, wherein the gate dielectric is a non-continuous film having portions above the STI and above the semiconductive substrate but not along the sidewall of the prominence of the STI;
   forming a wordline above the gate dielectric; and
   forming an active area in the semiconductive substrate, adjacent to and below the discrete storage element film.

2. The process of claim 1, wherein depositing the discrete storage element film includes sputtering a target selected from a metal and a nitride.

3. The process of claim 1, wherein forming the wordline above the gate dielectric includes depositing a polysilicon layer and etching back the polysilicon layer.

4. The process of claim 1, wherein forming the wordline above the gate dielectric includes depositing a metal layer and etching back the metal layer.

5. A process comprising:
   forming a shallow trench isolation (STI) in a semiconductive substrate, wherein the STI includes a prominence with a sidewall, the prominence having a top width wider than a bottom width of the prominence;
   forming an active area in the semiconductive substrate and adjacent the STI;
   repairing an etch stop layer above the active area to form a tunneling dielectric film;
   depositing a discrete storage element film upon the tunneling dielectric film, wherein depositing the discrete storage element film is carried out with exposure to, and laterally adjacent to, a reentrant undercut form factor of the sidewall of the STI, and wherein depositing the discrete storage element film is carried out without completely covering the reentrant undercut form factor of the sidewall of the STI;
   forming a gate dielectric above the discrete storage element film, wherein the gate dielectric is a non-continuous film having portions above the STI and above the semiconductive substrate but not along the sidewall of the prominence of the STI; and
   forming a control gate above the gate dielectric.

* * * * *